United States Patent
Scholz et al.

(10) Patent No.: US 11,774,501 B2
(45) Date of Patent: Oct. 3, 2023

(54) SWITCHING MONITORING DEVICE

(71) Applicant: Phoenix Contact GmbH & Co. KG, Blomberg (DE)

(72) Inventors: Peter Scholz, Brakel (DE); Elmar Schaper, Lügde (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 297 days.

(21) Appl. No.: 17/055,893

(22) PCT Filed: May 27, 2019

(86) PCT No.: PCT/EP2019/063672
§ 371 (c)(1),
(2) Date: Nov. 16, 2020

(87) PCT Pub. No.: WO2019/238403
PCT Pub. Date: Dec. 19, 2019

(65) Prior Publication Data
US 2021/0223317 A1 Jul. 22, 2021

(30) Foreign Application Priority Data

Jun. 15, 2018 (DE) .................... 10 2018 114 425.3

(51) Int. Cl.
*G01R 31/327* (2006.01)
(52) U.S. Cl.
CPC ................ *G01R 31/3278* (2013.01)
(58) Field of Classification Search
CPC .................................................. G01R 31/3278
See application file for complete search history.

(56) References Cited

U.S. PATENT DOCUMENTS

| 4,686,478 A | 8/1987 | Jabs |
| 2006/0212745 A1 | 9/2006 | Zansky et al. |
| 2007/0115604 A1 | 5/2007 | Zettel et al. |
| 2011/0128012 A1 | 6/2011 | Emoto |

(Continued)

FOREIGN PATENT DOCUMENTS

| CN | 1970331 A1 | 5/2007 |
| CN | 102301252 A | 12/2011 |

(Continued)

*Primary Examiner* — Walter L Lindsay, Jr.
*Assistant Examiner* — Milton Gonzalez
(74) *Attorney, Agent, or Firm* — Holland & Hart LLP

(57) ABSTRACT

A switching monitoring device for monitoring a switching operation of a relay switching contact of a relay includes a control terminal, a controller, and an impedance circuit. The control terminal is configured to apply a control signal for switching the relay switching contact to the relay switching contact. The controller is configured to produce an excitation signal. The impedance circuit has a signal input and a signal output, and the controller applies the excitation signal to the signal input. The impedance circuit converts the excitation signal into a switching monitoring signal and outputs the switching monitoring signal at the signal output for application to the relay switching contact. The controller is further configured to detect a change in a signal present at the impedance circuit and, if the change in the signal is present, detect the switching operation of the relay switching contact.

15 Claims, 6 Drawing Sheets

(56) References Cited

U.S. PATENT DOCUMENTS

| | | |
|---|---|---|
| 2013/0300423 A1 | 11/2013 | Klapper |
| 2015/0204946 A1 | 7/2015 | Kinoshita et al. |
| 2016/0146889 A1* | 5/2016 | Voß .................. H03K 17/18 |
| | | 324/415 |
| 2016/0195582 A1* | 7/2016 | Voß ................. G05B 19/0425 |
| | | 324/418 |
| 2016/0268079 A1 | 9/2016 | Kim |
| 2017/0199231 A1 | 7/2017 | Brunner et al. |
| 2017/0250043 A1 | 8/2017 | Hurwitz et al. |

FOREIGN PATENT DOCUMENTS

| | | |
|---|---|---|
| CN | 102681436 A | 9/2012 |
| CN | 103439649 A | 12/2013 |
| CN | 203535189 U | 4/2014 |
| CN | 104678296 A | 6/2015 |
| CN | 105425144 A | 3/2016 |
| CN | 105556628 A | 5/2016 |
| DE | 10146753 C1 | 4/2003 |
| DE | 102009006970 A1 | 8/2010 |
| DE | 102010011394 A1 | 9/2011 |
| DE | 10 2013 106 487 A1 | 12/2014 |
| DE | 102014016218 A1 | 4/2015 |
| DE | 202017002030 U1 | 6/2017 |
| DE | 202017002030 U1 | 8/2017 |
| EP | 1594021 A1 | 11/2005 |
| EP | 2237056 A1 | 10/2010 |
| EP | 2662697 A1 | 11/2013 |
| GB | 2090002 A | 6/1982 |
| GB | 2412443 A | 9/2005 |
| WO | WO 2003/030198 A1 | 4/2003 |
| WO | WO2017216061 A1 | 12/2017 |

* cited by examiner

SWITCHING MONITORING DEVICE

CROSS-REFERENCE TO RELATED APPLICATIONS

The present application is the national phase entry under 35 U.S.C. 371 of International Patent Application No. PCT/EP2019/063672 by Scholz et al., entitled "SWITCHING MONITORING DEVICE," filed May 27, 2019; and claims the benefit of German Patent Application No. 10 2018 114 425.3 by Scholz et al., entitled "SCHALTUBERWACHUNGSVORRICHTUNG," filed Jun. 15, 2018, each of which is assigned to the assignee hereof and is incorporated by reference in its entirety.

FIELD OF THE DISCLOSURE

The present disclosure relates to a switching monitoring device for monitoring a switching operation of a relay switching contact.

BACKGROUND

In electrical automation, actuators can each be switched with a relay. It may be necessary that an actual switching through of a relay switching contact is detected. Such detected feedback is usually implemented via the switching of the relay using additional auxiliary contacts. Alternatively, a forced contact control can be implemented to prevent incorrect switching of the relay. In the event of a faulty relay switching contact, which has, for example, defective, in particular welded buttons, the switching of further relay switching contacts and/or a connection of the welded buttons to another button can be prevented with the forced contact control. A forced contact control and/or feedback by means of auxiliary contacts can disadvantageously involve increased production costs in the manufacture of a relay.

SUMMARY

It is the object of the present disclosure to provide a more efficient switching monitoring device which provides information about the switching state of a relay switching contact, in particular as a function of the relay control.

This object is achieved by the features of the independent claim. Advantageous implementations of these features are the subject matter of the dependent claims, the description and the accompanying figures.

The present disclosure is based on the knowledge that the above object can be solved by a switching monitoring device which is adapted to apply a switching monitoring signal, in particular in the form of high-frequency auxiliary power, to the relay switching contact by means of a signal generator and a transmitter connected downstream of the signal generator. The switching monitoring signal is produced by the signal generator and coupled into the load circuit of the relay by the transmitter. A change in the impedance of the load circuit, in particular by switching the relay switching contact, is fed back to the signal generator via the transmitter and produces a signal change between the signal generator and the transmitter, which can be used to detect switching of the relay switching contact.

According to a first aspect, the disclosure relates to a switching monitoring device for monitoring a switching operation of a relay switching contact of a relay. The switching monitoring device has a controller which is adapted to produce an excitation signal and a control terminal which is adapted to apply a control signal for switching the relay switching contact to the relay switching contact.

The switching monitoring device further comprises an impedance circuit having a signal input and a signal output, wherein the controller is adapted to apply the excitation signal to the signal input. The impedance circuit is adapted to convert the excitation signal into a switching monitoring signal and to output the switching monitoring signal at the signal output for application to the relay switching contact.

The controller is also adapted to detect a change in a signal present at the impedance circuit and if the change in signal is present, to detect a switching operation of the relay switching contact.

In one example, the signal comprises the excitation signal and/or the switching monitoring signal.

In one example, the controller can be adapted to detect a change in the excitation signal present at the impedance circuit and to detect a switching operation of the relay switching contact when the change in the excitation signal is present. In particular, the controller can be adapted to detect a change in the excitation signal instead of monitoring the change in the switching monitoring signal. In addition to the impedance circuit, the controller can have a further signal monitoring circuit for monitoring a change in the switching monitoring signal. This signal monitoring circuit can be adapted to detect a change in the switching monitoring signal by means of capacitive or inductive coupling.

With the monitoring of the relay switching contact by the switching monitoring device, switching information relating to the transition of the relay switching contact between a first switching state in which the relay switching contact is electrically non-conductive and a second switching state in which the relay switching contact is electrically conductive can be produced when the control signal is applied to the relay. This can ensure that the relay switches with the control signal and that there is accordingly no fault in the relay switching contact and/or at a magnet system of the relay. Accordingly, if the control signal is applied to the relay and if the relay switching contact fails to switch, a malfunction of the relay can be determined. Switching of the relay when the switching signal drops can also be detected.

The switching monitoring device achieves the advantage that under the aspect of functional safety, in particular in accordance with the IEC 61508 standard, the switching state of the relay switching contact can be clearly detected. Correspondingly, an increased diagnostic coverage can be achieved.

In one example, the relay is adapted to transmit signals in a first frequency range and the switching monitoring signal is in a second frequency range, wherein the second frequency range has higher frequencies than the first frequency range, and wherein the impedance circuit has a higher impedance in the first frequency range than in the second frequency range.

The impedance circuit can form a frequency filter, in particular a bandpass filter, which has a lower impedance for the switching monitoring signal and/or the excitation signal than for electrical signals with other frequencies. Accordingly, coupling in of electrical signals from a voltage source and/or from a further signal source with a corresponding power transmission can be prevented and/or attenuated. For example, the first frequency range can include frequencies from 0 Hz to 100 Hz and/or the second frequency range can include frequencies above 10 kHz, in particular the frequency range from 100 kHz to 500 kHz. With the higher impedance in the first frequency range, a current flow on the output side can in particular be reduced. Correspondingly, by coupling the signal input to the signal output in the first frequency range, a current flow on the input side can be reduced.

The impedance circuit can in particular have a two-port which is formed by a 2×2 impedance matrix. The impedance at the signal output can be higher for low frequencies, for example in the frequency range from 10 Hz to 100 Hz, in particular 50 Hz, than for high frequencies, for example in the frequency range from 100 kHz to 1 MHz, in particular 500 kHz. For example, the impedance can be 13 MOhm at a frequency of 50 Hz and 3 kOhm at a frequency of 500 kHz. Correspondingly, a frequency-dependent impedance difference between the first frequency range and the second frequency range of three to four orders of magnitude can be achieved.

In one example, the controller is adapted to produce the excitation signal in the second frequency range. This has the advantage that the impedance circuit can efficiently convert the excitation signal into the switching monitoring signal due to the lower impedance in the second frequency range.

In one example, the controller comprises a measuring circuit for monitoring the change in the excitation signal. The measuring circuit can in particular be adapted to detect a change in amplitude of the excitation signal, for example a change in voltage amplitude and/or a change in current amplitude.

Furthermore, the measuring circuit can be adapted to detect a frequency deviation of the frequency of the excitation signal. Furthermore, the measuring circuit can have an analog-digital converter and/or a measuring signal amplifier in order to further process the measuring signal, in particular a current and/or voltage change in the excitation signal.

In one example, the controller comprises a signal generator for generating the excitation signal. The signal generator can in particular be adapted to produce the excitation signal in the form of a periodic voltage signal. For example, the excitation signal can have a rectangular, sawtooth or sinusoidal signal shape. The frequency of the excitation signal can be set to a predetermined value by means of the signal generator. Furthermore, the signal generator can be adapted to produce the excitation signal with a fixed frequency value.

In one example, the measuring circuit has a current sensor which is connected between the signal generator and the impedance circuit, wherein the current sensor is adapted to detect a current flow between the signal generator and the impedance circuit and to provide it to the controller as a measured current value, and wherein the controller is adapted to detect a change in the current flow between the signal generator and the impedance circuit on the basis of the measured current value.

The current sensor can be formed by a resistor, in particular an ohmic resistor, at which a current flow between the signal generator and the impedance circuit can be measured in the form of a measurement voltage. The controller can further include a voltage measuring device which is adapted to detect the measurement voltage.

Further, the controller can comprise a voltage sensor which is adapted to detect a change in a voltage amplitude of the excitation signal in order to detect a switching of the relay switching contact.

In one example, the impedance circuit is adapted to galvanically separate the relay switching contact from the signal generator and/or the controller. The relay switching contact can have an electrical power applied to it, wherein it is possible for this electrical power to be prevented from being coupled into the controller and/or the signal generator by means of the galvanic isolation in the impedance circuit. This electrical power can in particular be greater than a power which the signal generator applies on the impedance circuit.

In one example, the impedance circuit comprises a transformer with a primary-side coil and a secondary-side coil, wherein the secondary-side coil is connected in parallel to the relay switching contact, and wherein the primary-side coil is connected to the signal generator.

The transformer can in particular be adapted to convert the excitation signal into the switching monitoring signal, wherein a current amplitude and/or a voltage amplitude of the switching monitoring signal as a function of the winding ratio of the primary-side coil to the secondary-side coil is proportional to a current amplitude and/or a voltage amplitude of the excitation signal. The primary-side coil and the secondary-side coil can be coupled electromagnetically so that changes in the switching monitoring signal by means of the transformer can be applied to the input side of the excitation signal.

If the relay switching contact is in the first switching state, there may not be a low-impedance connection for the switching monitoring signal, so that a current with a lower current intensity than in the second switching state can flow through the secondary-side coil.

The capacitor arranged in parallel to the relay switching contact can form an oscillating circuit with the secondary-side coil with a predetermined resonance frequency. This oscillating circuit can have less damping with the relay switching contact in the second switching state than with the relay switching contact in the first switching state. Accordingly, when the oscillating circuit is excited by the signal generator, an oscillation amplitude of the oscillating circuit with the relay switching contact in the second switching state can be higher than an oscillation amplitude of the oscillating circuit with the relay switching contact in the first switching state. The controller can be adapted to detect this change in amplitude of the oscillation by means of a resistor arranged between the signal generator and the signal input.

In one example, an additional electromagnetic coil can be arranged on the primary-side coil of the transformer, which is adapted to detect a change in the excitation signal in the event of a change in the switching monitoring signal by switching the relay switching contact. The controller can be adapted to evaluate a signal induced in the additional electromagnetic coil in order to detect a switching of the relay switching contact. The additional electromagnetic coil can be arranged next to the primary-side coil on a ferromagnetic core of the transformer. In one example, the further electromagnetic coil can at least partially enclose the primary-side coil, in particular it can be wound over the primary-side coil.

In one example, the impedance circuit has a capacitor which is arranged in series with the secondary-side coil, wherein the capacitor is adapted to form a reactance for alternating current voltage signals which are applied to the relay switching contact.

The impedance circuit can act on the relay switching contact with an in particular periodic switching monitoring signal. In the first switching state, an impedance at the signal output can be determined by the capacitor. In the second switching state, the impedance at the signal output can be lower than the impedance at the signal output when the relay switching contact is in the first switching state. With a lower impedance at the signal output, a current intensity of the current flowing through the signal output of the impedance circuit can be greater than with a higher impedance at the signal output. The impedance circuit can be adapted to couple a corresponding change in current intensity to the signal input, so that a current intensity of a current flowing through the signal input increases with a reduced impedance on the output side.

Furthermore, when the relay switching contact is switched, a voltage amplitude of the switching monitoring signal can change, wherein upon change in the voltage amplitude of the switching monitoring signal changing a current and/or voltage amplitude of the excitation signal can change.

The capacitor can also form a reactance for alternating current voltage signals which are produced by a voltage source and are applied to the relay switching contact. Furthermore, the capacitor can be adapted to reduce a power loss at the signal output and/or leakage currents which can flow with the relay switching contact in the first switching state through the signal output.

The capacitor can be adapted to withstand an alternating voltage and/or a direct voltage of 230 V including expected transients in a non-destructive manner.

In one example, the capacitor can be formed by a plate capacitor in the form of conductor tracks on a printed circuit board. The properties of the capacitor can be determined by the circuit board material and/or the circuit board thickness, so that a defined dielectric strength can be achieved by a distance between two conductor track sections and/or conductor surfaces. The circuit board material can in particular be FR4, which is formed from a glass fiber fabric, in particular with a di/tetra-epoxy matrix.

In one example, the signal input is bipolar with a first input connection and a second input connection and the signal output is bipolar with a first output connection and a second output connection, and wherein a first capacitor is arranged between the first output connection and the first input connection, and wherein a second capacitor is arranged between the second output connection and the second input connection in order to capacitively couple the switching monitoring signal to the relay switching contact.

In one example, the impedance circuit has an inductance, which is connected downstream of the first capacitor, wherein the inductance forms an oscillating system with the first capacitor between the first output connection and the first input connection.

In one example, the switching monitoring device comprises a first coupling capacitor, a second coupling capacitor and a signal monitoring circuit. The first coupling capacitor can be connected to the first output connection and the second coupling capacitor can be connected to the second output connection, and the coupling capacitors are connected to the signal monitoring circuit and are adapted to convert the switching monitoring signal into a test signal and provide the test signal to the signal monitoring circuit, and/or wherein the signal monitoring circuit is adapted to detect a change in the test signal and detect a switching operation of the relay switching contact when the change in the test signal is present.

Furthermore, the first coupling capacitor, the second coupling capacitor and/or the signal monitoring circuit can be integrated into the controller. In one example, the impedance circuit can comprise the coupling capacitors.

In one example, the control can be connected to the control terminal and is adapted to produce a control signal for switching the relay switching contact and/or to apply the control signal to the control terminal.

The inductance can in particular be an electromagnetic coil which has an electrical inductance which is matched to the capacitance of the upstream capacitor in such a way that the combined impedance of the electromagnetic coil and the capacitor is minimal at a resonance frequency. The signal generator can be adapted, for example, to produce the excitation signal with the resonance frequency.

In one example, the impedance circuit has a further inductance, which is connected downstream of the second output connection, the further inductance forms a further oscillatory system with the second capacitor between the second output connection and the second input connection.

In one example, the impedance circuit is adapted to apply the switching monitoring signal to the relay switching contact in the form of high-frequency auxiliary energy, which in particular has a frequency in the range from 10 kHz to 1 MHz. The signal generator preferably produces the excitation signal with a frequency of 100 kHz to 500 kHz, which can in particular be a square-wave clock signal. The frequency of the excitation signal can be fixed and/or predetermined by the controller. The impedance circuit can be adapted to convert the excitation signal with a coupling frequency into the switching monitoring signal with the coupling frequency.

In one example, the controller comprises a switching controller which is adapted to produce the control signal for switching the relay switching contact and to apply a control signal to a magnet system of the relay, in order to switch the relay switch contact.

The controller can also be adapted to supply the signal generator with electrical energy. Activation of the relay can be coupled with generation of the excitation signal by the signal generator, so that, for example, the excitation signal can be produced at the same time as the activation of the relay and the switching monitoring signal can be applied to the relay switching contact.

In one example, the controller is adapted to apply the control signal to the signal generator, and the signal generator is adapted to produce the excitation signal with the switching signal. This has the advantage that the same electrical signal, which is also used to control the relay, can be fed to the signal generator. Accordingly, a separate energy supply for the signal generator and/or the controller can be omitted.

In one example, the controller can be adapted to detect a current intensity of the switching signal and/or a current intensity of the current flowing through a relay coil of the magnet system, in particular by means of a shunt resistor.

The relay switching contact can have a typical switch-on delay of 1 ms to 50 ms, whereby with a simultaneous activation of the relay and the signal generator with the activation signal, the switching monitoring signal is applied to the relay switching contact before the relay switching contact changes between the first switching state and the second switching state according to the activation signal. The signal chain from the signal generator via the impedance circuit to the relay switching contact can accordingly have a shorter signal propagation time than the switch-on delay of the relay.

Furthermore, the signal generator can be adapted to continue producing the excitation signal after a drop in the control signal for a time interval which is in particular greater than a typical switch-off delay of the relay, in order to detect a change in the relay switching contact from the second switching state to the first switching state.

The switching monitoring device can be adapted to apply a relay control signal applied to the controller for controlling the relay to the signal generator, the impedance circuit and/or the magnet system of the relay, in order to supply energy to the respective component. Accordingly, a separate energy source and/or energy supply for the signal generator, the impedance circuit and/or the controller can be omitted, since these can be directly supplied with electrical energy with the relay control signal.

In one example, the signal generator is adapted to produce the excitation signal in the form of a periodic clock signal, and the controller is adapted to detect a time interval between producing the excitation signal and a change in the excitation signal when the impedance at the signal output changes, based on the constant period of the excitation signal, in order to detect a switching time delay of the relay switching contact.

The controller can in particular be adapted to detect a number of periods and/or clock cycles of the excitation signal and to detect the time interval between the generation of the excitation signal and switching of the relay switching contact in accordance with the fixed frequency of the excitation signal. When the relay switching contact is switched, an impedance on the output side can change, which causes a change in the excitation signal. The change in the excitation signal can be detected by the controller by means of a sensor in order to determine a switching of the relay switching contact and an end of the time interval between relay activation and switching of the relay switching contact.

The controller can also be adapted to control the signal generator before the relay switching contact switches. Accordingly, the switching monitoring signal can be applied to the relay switching contact during a switching-on process of the relay switching contact and/or during a switching-off process of the relay switching contact. The switching monitoring signal can advantageously be switched off while the relay switching contact is in the first switching state or the second switching state. In particular, the switching monitoring signal is only present during a switching time in which the relay switching contact changes between the first switching state and the second switching state.

In one example, the controller has a control output, and the controller is adapted to provide a status signal at the control output, which is active after the relay switching contact is switched on and is inactive after the relay switching contact is switched off.

This achieves the advantage that status signals from a plurality of Switching monitoring devices can be aggregated at a central point in order to switch a plurality of relays non-centrally and in particular remotely from the installation location of the respective relay of the plurality of relays.

The control output can also be an error signaling contact and/or an image of the relay switching contact. Furthermore, the control output can include an analog and/or digital interface which is adapted to transmit information about the relay and the switching state of the relay.

In one example, the switching monitoring device comprises a first damping element and the signal output has a first output connection, which is followed by the first damping element, in order to dampen high-frequency signals which are transmitted to the relay switching contact by means of the impedance circuit and/or an electrical load and/or voltage source coupled to the relay switching contact.

This achieves the advantage that the properties of the switching monitoring device can be improved with regard to electromagnetic compatibility. The damping elements can in particular be adapted to dampen a signal amplitude of the switching monitoring signal in order to reduce electromagnetic radiation of the switching monitoring signal in the vicinity of the switching monitoring device and/or the relay.

In one example, the switching monitoring device comprises a second damping element and the signal output has a second output connection, which is followed by the second damping element, in order to dampen high-frequency signals which are transmitted by means of the impedance circuit to the relay switching contact and/or an electrical load and/or voltage source coupled to the relay switching contact.

In one example, the first damping element and/or the second damping element each have an inductance, and the respective inductance forms a minimum impedance for the switching monitoring signal in order to prevent a bypass of the switching monitoring signal via the electrical load and/or the voltage source.

This has the advantage that a switching of the relay switching contact between the first switching state and the second switching state can be reliably detected even with a low-impedance current source and/or a low-impedance electrical load. If a current path through the current source and the electrical load has a lower impedance than, for example, the capacitor connected in parallel to the relay switching contact, the switching monitoring signal can flow via the current source and/or the electrical load, so that switching the relay switching contact does not have an impedance registered at the signal output or only influence such impedance to a lesser extent.

The inductances are advantageously adapted to have a low resistance in order to minimize power losses when a current flows through the inductance occurs. In one example, the inductances are adapted to have a total load current, which flows through the relay switching contact and is determined by the power of a voltage source and an impedance of a load applied to the relay switching contact. The inductances can be arranged together on a coil core, in particular a magnetic core, and in particular form a current-compensated choke. The inductances can furthermore be nested in one another with winding directions directed opposite one another in order to form the highest possible push-pull impedance for the switching monitoring signal.

BRIEF DESCRIPTION OF THE DRAWINGS

Further exemplary implementations of the principles described herein are explained with reference to the accompanying figures. They show.

DETAILED DESCRIPTION

Figure 1:
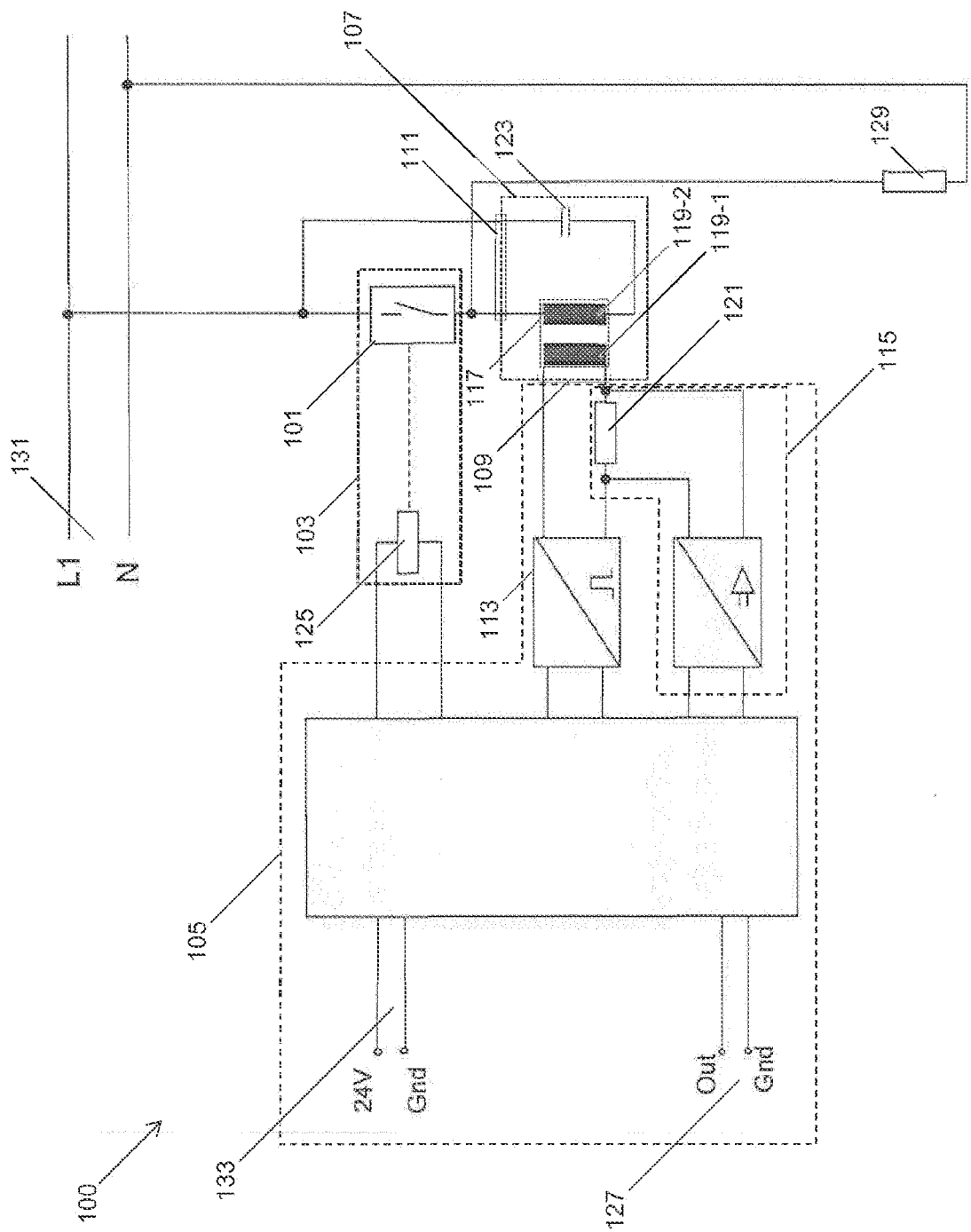
FIG. 1 shows a switching monitoring device in an example.

FIG. 1 shows a schematic representation of a switching monitoring device 100 for monitoring a switching operation of a relay switching contact 101 of a relay 103. The switching monitoring device 100 has a controller 105 which is adapted to produce a control signal for switching the relay switching contact 101 and an excitation signal.

The switching monitoring device 100 further comprises an impedance circuit 107 having a signal input 109 and a signal output 111. The controller 105 is adapted to apply the excitation signal to the signal input 109. The impedance circuit 107 is adapted to convert the excitation signal into a switching monitoring signal and to output the switching monitoring signal at the signal output 111 for applying on the relay switching contact 101.

In addition, the controller 105 is adapted to detect a change in a signal present at the impedance circuit 107, in particular the excitation signal and/or the switching monitoring signal, and to determine a switching operation of the relay switching contact 101 when the signal change is present.

The relay 103 is provided to transmit signals in a first frequency range and the switching monitoring signal is in a second frequency range, wherein the second frequency range has higher frequencies than the first frequency range. Furthermore, the impedance circuit 107 has a higher impedance in the first frequency range than in the second frequency range.

The controller 105 further comprises a signal generator 113, which is adapted to produce the excitation signal in the second frequency range. The impedance circuit 107 is adapted to galvanically separate the relay switching contact 101 from the signal generator 113 and/or the controller 105.

The controller 105 also comprises a measuring circuit 115 for monitoring the change in the excitation signal. The measuring circuit 115 has a current sensor 121 which is connected between the signal generator 113 and the impedance circuit 107. The current sensor 121 is adapted to detect a current flow between the signal generator 113 and the impedance circuit 107 and to provide it to the controller 105 as a measured current value. Furthermore, the controller 105 is adapted to detect a change in the current flow between the signal generator 113 and the impedance circuit 107 on the basis of the measured current value.

The impedance circuit 107 comprises a transformer 117 with a primary-side coil 119-1 and a secondary-side coil 119-2, wherein the secondary-side coil 119-2 is connected in parallel to the relay switching contact 101, and the primary-side coil 119-1 is connected to the signal generator 113. Furthermore, the impedance circuit 107 comprises a capacitor 123 which is arranged in series with the secondary-side coil 119-2. The capacitor 123 is adapted to form a reactance for alternating current voltage signals which are applied to the relay switching contact 101.

Furthermore, the impedance circuit 107 is adapted to apply the switching monitoring signal in the form of high-frequency auxiliary energy, which in particular has a frequency in the range from 10 kHz to 1 MHz to the relay switching contact 101.

Furthermore, the controller 105 comprises a switching controller which is adapted to produce the control signal for switching the relay switching contact 101 and to apply the control signal to a magnet system 125 of the relay 103 in order to switch the relay switching contact 101.

In one example, the controller 105 is adapted to apply the control signal to the signal generator 113, and the signal generator 113 is adapted to produce the excitation signal with the switching signal.

Furthermore, the signal generator 113 is adapted to produce the excitation signal in the form of a periodic clock signal, and the controller 105 is adapted, based on the constant period of the excitation signal, to detect a time interval between the generation of the excitation signal and a change in the excitation signal when the impedance at the signal output 111 changes, in order to detect a switching time delay of the relay switching contact 101.

The controller 105 also includes a control output 127 and the controller 105 is adapted to provide a status signal at the control output 127, which is active after the relay switching contact 101 is switched on and is inactive after the relay switching contact 101 is switched off.

The controller 105 further comprises a control input 133, via which the controller 105 can be supplied with electrical energy. In particular, the controller 105 can be adapted to receive electrical energy in the form of a direct voltage in the range from 3 V to 24 V.

Figure 2:
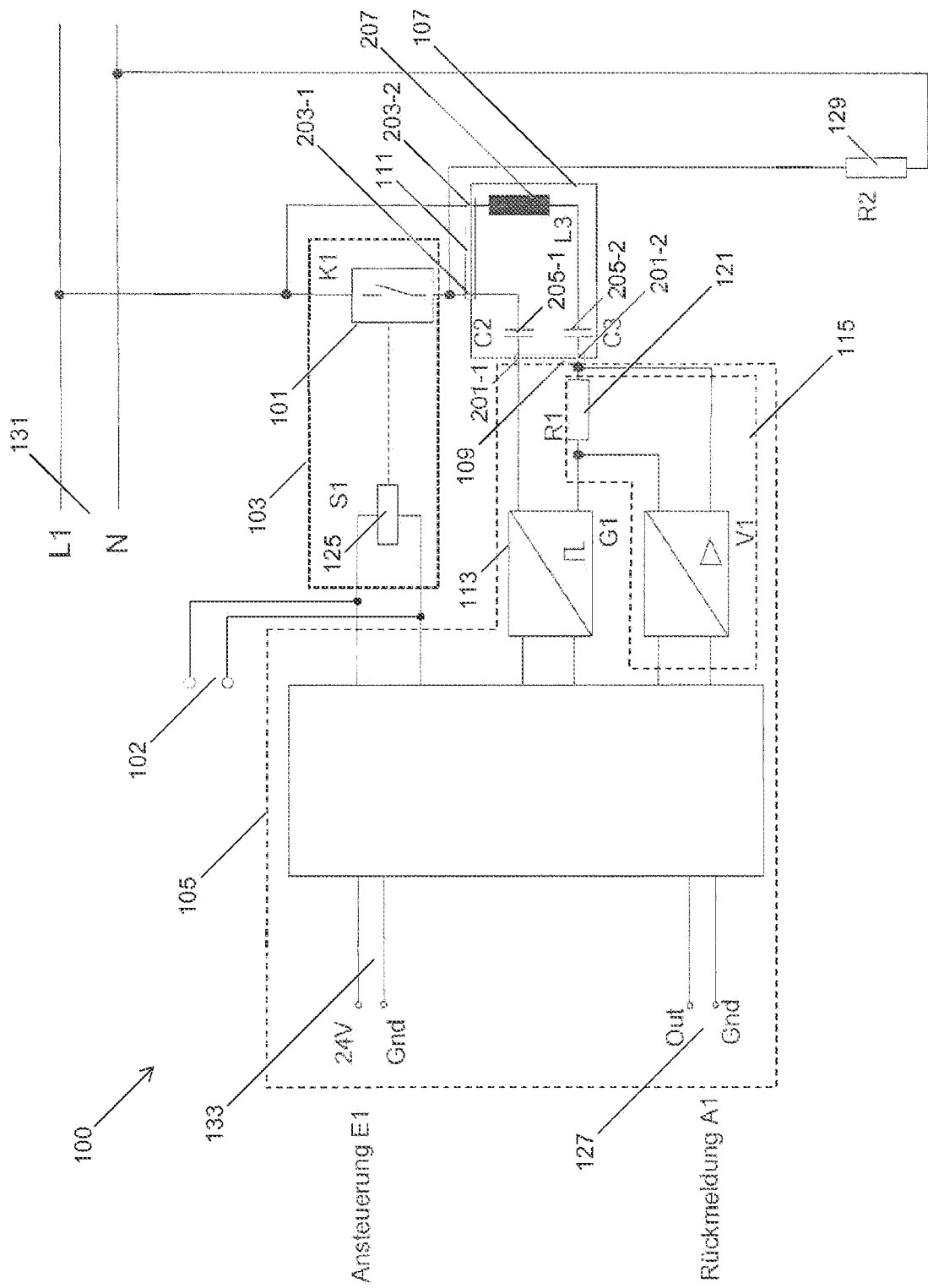
FIG. 2 shows a switching monitoring device in an example.

FIG. 2 shows a schematic illustration of a switching monitoring device 100 for monitoring a switching operation of a relay switching contact 101 of a relay 103 in an example. The signal input 109 is bipolar with a first input connection 201-1 and a second input connection 201-2 and the signal output 111 is bipolar with a first output connection 203-1 and a second output connection 203-2. Furthermore, a first capacitor 205-1 is arranged between the first output connection 203-1 and the first input connection 201-1 and a second capacitor 205-2 is arranged between the second output connection 203-2 and the second input connection 201-2 in order to capacitively couple the switching monitoring signal the relay switching contact 101.

Furthermore, the impedance circuit 107 comprises an inductance 207, which is connected downstream of the first capacitor 205-1, wherein the inductance 207 forms an oscillatable system with the first capacitor 205-1 between the first output connection 203-1 and the first input connection 201-1.

Figure 3:
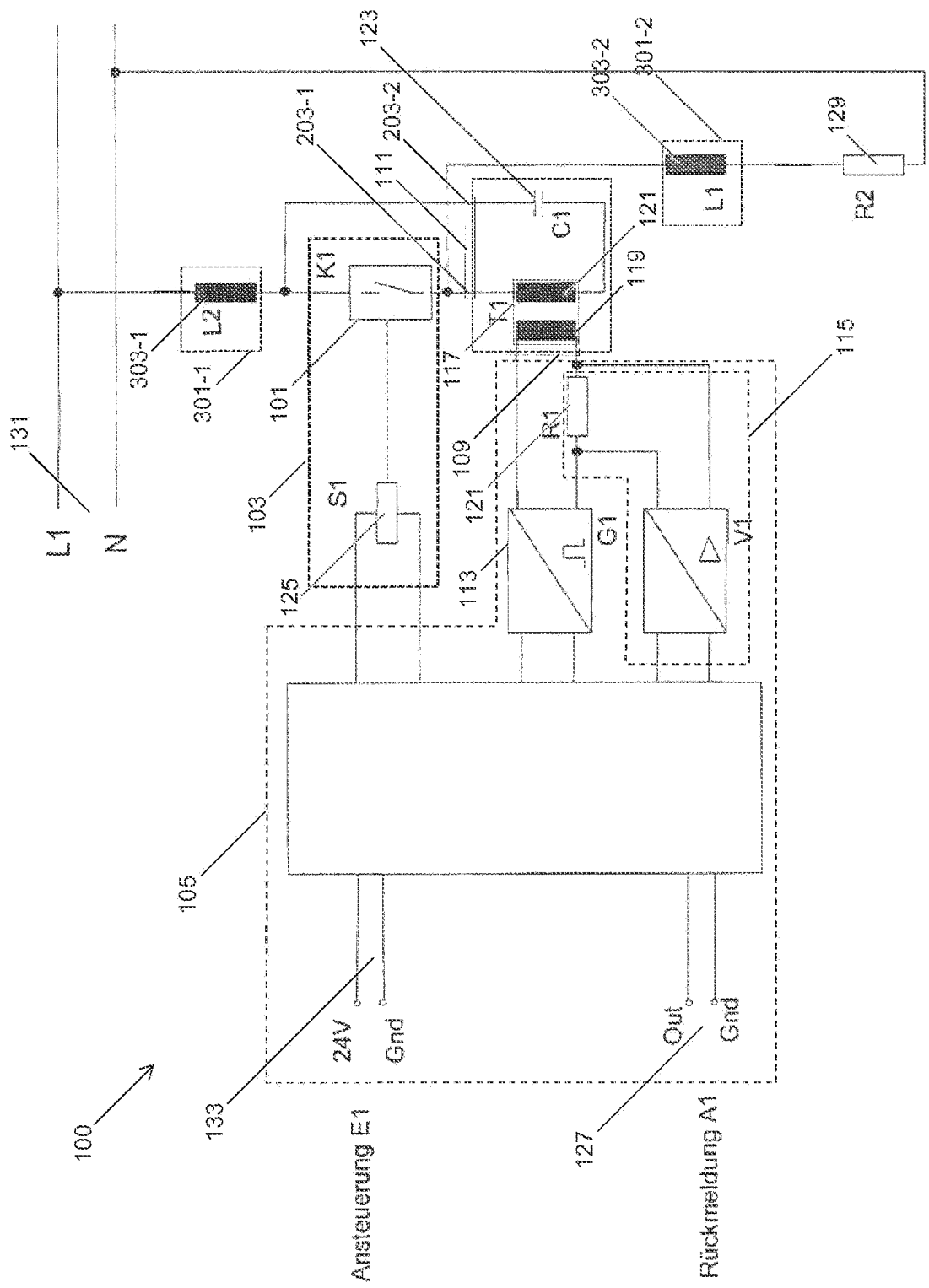
FIG. 3 shows a switching monitoring device in an example.

FIG. 3 shows a schematic representation of a switching monitoring device 100 for monitoring a switching operation of a relay switching contact 101 of a relay 103 according to the example shown in FIG. 1.

In addition, the switching monitoring device 100 comprises a first damping element 301-1 and a second damping element 301-2. The signal output 111 has a first output connection 203-1 and a second output connection 203-2, wherein the first damping element 301-1 is connected downstream of the first output connection 203-1 and the second damping element 301-2 is connected downstream of the second output connection 203-2, in order to absorb high-frequency signals, which are applied to the relay switching contact 101 by means of the impedance circuit 107 and/or an electrical load 129 and/or voltage source 131 coupled to the relay switching contact 101.

The first damping element 301-1 and the second damping element 301-2 each have an inductance 303-1, 303-2, which forms a minimum impedance for the switching monitoring signal in order to prevent a bypass of the switching monitoring signal via the electrical load 129 and/or the voltage source 131.

Figure 4:
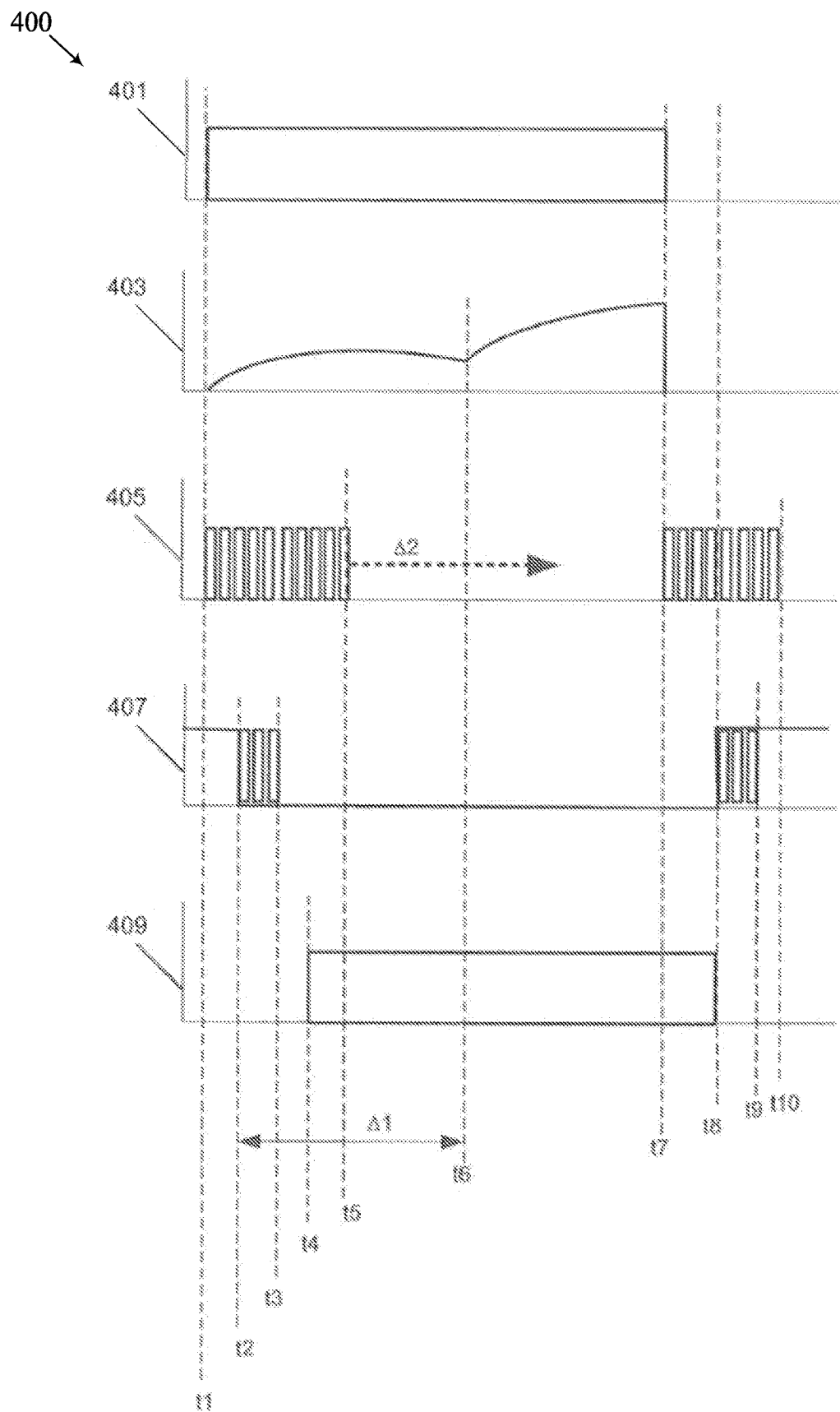
FIG. 4 shows signal forms when a relay is activated by means of the switching monitoring device in an example.

FIG. 4 shows a schematic illustration of signal forms 400 when a relay is activated by means of the Switching monitoring device. At a first point in time t1, a relay control signal is applied to an electromagnetic relay coil of the magnet system of the relay. A coil voltage 401 is correspondingly applied to the electromagnetic relay coil. When the coil voltage 401 is applied to the electromagnetic relay coil, a coil current 403 in the electromagnetic relay coil increases.

Furthermore, from the point in time t1, the signal generator of the switching monitoring device produces the excitation signal 405 in the form of a square-wave signal, which in particular has an exclusively positive signal amplitude. By means of the impedance circuit, the excitation signal 405 is converted into the switching monitoring signal 407, which is applied to the relay switching contact. From the point in time t2, the switching monitoring signal 407 has the signal form of the excitation signal 405.

Up to the point in time t2, the relay switching contact is in the first switching state and is accordingly electrically non-conductive or high-resistance. The total resistance that can be detected at the two-pole signal output of the impedance circuit can be determined by the external wiring consisting of an electrical load and/or a voltage source. Furthermore, in one example, the damping elements, in particular in the form of inductances, can contribute to the total resistance. According to the total resistance, a current flow can be detected between the signal generator and the impedance circuit by means of the current sensor.

From time t2, the relay switching contact switches from the first switching state to the second switching state, wherein the time interval between t2 and t3 determining a bounce duration of the relay switching contact. When the relay switching contact is switched, the switching monitoring signal 407 breaks in in the form of a voltage at the relay switching contact. The total resistance at the signal output of the impedance circuit changes accordingly, since the electrically conductive relay switching contact with the capacitor arranged parallel to the relay switching contact has a lower impedance compared to the electrically non-conductive relay switching contact. The change in the total resistance can produce a change in a primary-side signal at the signal input or the signal generator, which can be, for example, a changed current amplitude that can be detected by means of the current sensor.

The controller is adapted to detect the change in current at time t2 and, accordingly, to detect a switching of the relay switching contact at time t2. The controller can also be adapted to switch off the signal generator and, accordingly, the excitation signal 405 at time t5. Alternatively, the controller can be adapted to continuously produce the excitation signal 405 in order to continuously apply the switching monitoring signal 407 to the relay switching contact. In particular, the excitation signal 405 can be produced in the time interval 42 between the time t5 and the time t7.

In one example, the controller is adapted to control the signal generator cyclically in order to produce the excitation signal 405 at recurring intervals and to detect the switching state of the relay switching contact. The controller can be adapted accordingly using an absolute amplitude value and/or effective amplitude value of an amplitude of the excitation signal 405 to detect whether the relay switching contact is in the first switching state or in the second switching state. Accordingly, with a periodic check of the relay switching contact by means of the Switching monitoring device, it can be ensured, for example, that the relay switching contact is electrically conductive.

When the relay switching contact is switched to the second switching state, the controller produces a status signal 409 at the control output in order to produce feedback on the switching of the relay switching contact.

Switching off the relay by changing the relay switching contact from the second switching state to the first switching state can be implemented by switching off the relay control signal at time t7. From time t7, the signal generator can be switched on in order to produce the excitation signal 405 and accordingly to apply the switching monitoring signal 407 to the relay switching contact. The signal generator can be switched off at time t10.

The relay switching contact begins to open from time t8 and accordingly disconnect the electrical connection via the relay switching contact. From time t9, the switching contact is completely open and no longer electrically conductive. An arc between the opening contact points of the relay switching contact can be extinguished from time t9.

A time interval between times t2 and t3, in which the relay switching contact bounces, and a further time interval between times t8 and t9, in which an arc is formed at the relay switch contact, can vary for each switching operation. The signal generator remains switched on beyond the respective time interval in order to be able to detect the time deviation of the respective time interval and/or the complete activation or deactivation process of the relay switching contact.

The controller can also be adapted to determine a number of bounces and/or a bounce duration on the basis of the signal curve of the excitation signal 405 and the signal curve of the switching monitoring signal 407. Furthermore, the control can be adapted to compare the determined bounce duration and/or the determined number of bounces with a respective limit value.

The controller can also be adapted to detect the coil current 403 and to determine an armature impact time t6 on the basis of the temporal amplitude profile of the coil current 403 when the switching signal is applied to the electromagnetic relay coil. The armature impact time t6 can be defined in that the magnet system has deflected an armature of the relay to the maximum and, accordingly, a working air gap between a yoke of the relay and the armature has been completely overcome. Furthermore, at the armature impact time t6, a mechanical contact between buttons of the relay switching contact can be subjected to a maximum possible compressive force. The controller can be adapted to determine the point in time t2, from which the relay switching contact is electrically conductive, and the point in time of armature impact t6.

Furthermore, the controller can be adapted to determine a time interval Δ1 between time t2 and time t6. With the signal curves of the excitation signal 405, the switching monitoring signal 407 and/or the coil current 403 in the time interval Δ1, the controller can be adapted to determine typical relay parameters. Furthermore, the control can be adapted to determine the typical relay parameters continuously or at periodic intervals in order to determine wear, a failure probability and/or a maintenance or replacement time of the relay from a time profile of the relay parameters. The controller can also be adapted to detect a switching cycle of the relay.

Furthermore, the controller can be adapted to switch the status signal 409 active from the time t4 and to increase a signal amplitude of the status signal 409 accordingly. Furthermore, the controller can be adapted to switch the status signal 409 inactive from time t8 and to reduce a signal amplitude of the status signal 409 accordingly.

Figures 5, 6:
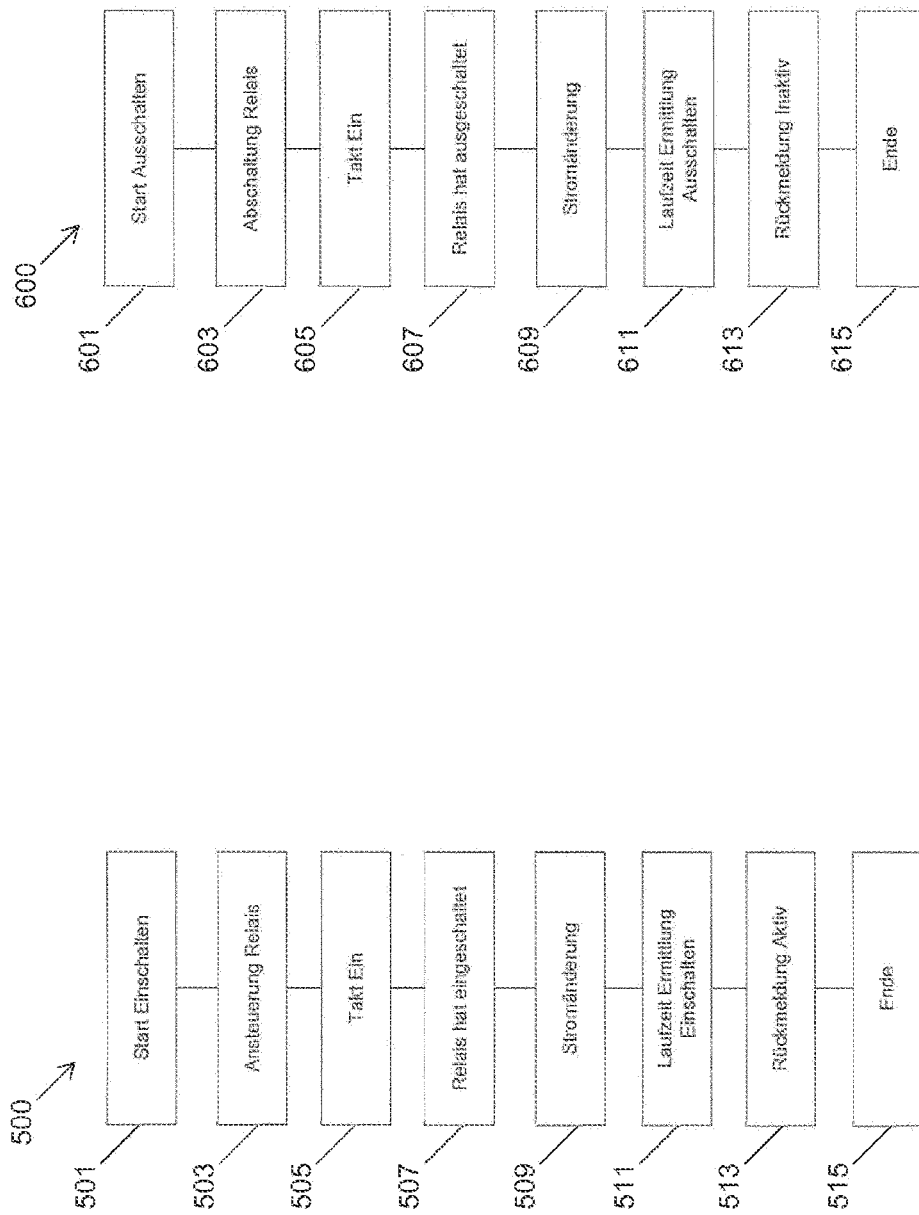
FIG. 5 shows an event sequence when a relay is switched on by means of the switching monitoring device in an example.
FIG. 6 shows an event sequence when a relay is switched off by means of the switching monitoring device in an example.

FIG. 5 shows an event sequence 500 of switching on a relay by means of the switching monitoring device in one example. The event sequence 500 begins with the start of switching on 501, which is characterized in that a relay control signal is present at the control input of the controller. The control then acts on the magnet system of the relay with the activation signal, so that the relay 503 is activated. The signal generator is then switched on in order to produce the clock signal, identified by Clock On 505. After the switch-on delay of the relay, the relay switching contact closes and the relay has switched on 507.

When the relay switching contact is closed, the current flow through the relay switching contact changes and accordingly through the signal output of the impedance circuit, so that a current change 509 occurs on the input side. By switching on the transit time determination 511, a switch-on time of the relay switching contact can be determined and recorded by the control.

The control then switches the feedback to active 513 by switching the status signal 409 active at the control output. This completes the switching on of the relay and the event sequence 500 ends 515.

FIG. 6 shows an event sequence 600 of switching off a relay by means of the switching monitoring device in one example. The event sequence 500 begins with the start of switching off 601, which is characterized in that a relay control signal is no longer present at the control input of the controller. Correspondingly, the control signal is not applied to the magnet system of the relay. The signal generator is then switched on in order to produce the clock signal, identified by clock on 605. After the switch-off delay of the relay has elapsed, the relay switching contact opens and the relay has switched off 507.

When the relay switching contact is opened, the current flow through the relay switching contact and accordingly through the signal output of the impedance circuit changes, so that a current change 609 occurs on the input side. By switching off the running time determination 611, a switch-off time can be detected by the control in order to determine a running time of the relay based on the difference between the switch-on time and the switch-off time.

The control then switches the feedback to inactive 613 by switching the status signal 409 to inactive at the control output. The switching off of the relay is thus complete and the event sequence 600 ends 615.

Figure 7:
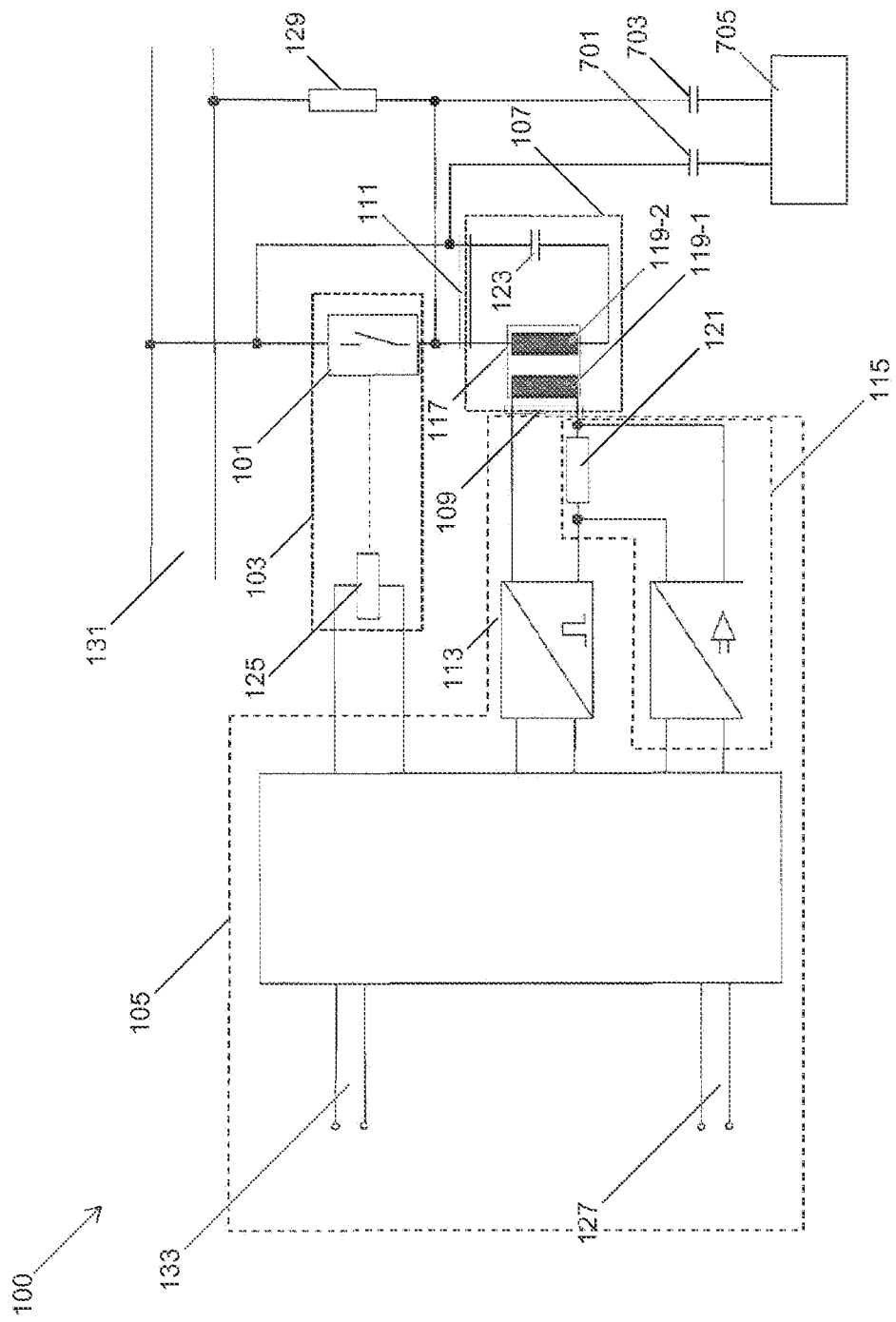
FIG. 7 shows a schematic representation of a switching monitoring device for monitoring a switching operation of a relay switching contact of a relay.

FIG. 7 shows a schematic representation of a switching monitoring device 100 for monitoring a switching operation of a relay switching contact 101 of a relay 103. The switching monitoring device 100 further comprises two coupling capacitors 701, 703 and a signal monitoring circuit 705. The capacitors 701, 703 are connected on the input side to the signal output 111 and connected on the output side to the signal monitoring circuit 705. Furthermore, the coupling capacitors 701, 703 are adapted to capacitively couple a signal applied to the relay switching contact, in particular the switching monitoring signal, to the signal monitoring circuit 705.

This achieves the advantage that the impedance circuit 107 can inductively couple the switching monitoring signal to the relay switching contact 101 and a change in the switching monitoring signal can be capacitively detected by means of the coupling capacitors 701, 703 and provided to the signal monitoring circuit 705. The signal monitoring circuit 705 can be adapted to detect a change in the switching monitoring signal and to provide the status signal. Furthermore, the coupling capacitors 701, 703 and/or the signal monitoring circuit 705 can be part of the controller 105 and/or be integrated into it.

LIST OF REFERENCE NUMBERS

100 Switching monitoring device
101 relay switching contact
103 relay
105 control
107 impedance circuit
109 signal input
111 signal output
113 signal generator
115 measurement circuit
117 transformer
119-1 primary side coil
119-2 secondary side coil
121 current sensor
123 capacitor
125 magnet system
127 control output
129 electrical load
131 power source
133 control input
201-1 first input port
201-2 second input port
203-1 first output port
203-2 second output port
205-1 first capacitor
205-2 second capacitor
207 inductance
301-1 first damping element
301-2 second damping element
303-1 inductance
303-2 inductance
400 waveforms
401 coil voltage
403 coil current
405 excitation signal
407 switching monitoring signal
409 status signal
t1 point in time
t2 point in time
t3 point in time
t4 point in time
t5 point in time
t6 point in time
t7 point in time
t8 point in time
t9 point in time
t10 point in time
Δ1 time interval
Δ2 time interval
500 event sequence
501 start Power on
503 control relay
505 cycle on
507 relay switched on
509 change in current
511 switch on runtime determination
513 feedback active
515 end of power-up
600 event sequence
601 start switch off
603 switch off relay
605 cycle on
607 relay has switched off
609 change in current
611 switch off runtime determination
613 Feedback inactive
615 End of switch-off
701 coupling capacitor
703 coupling capacitor
705 signal monitoring circuit

What is claimed is:

1. A switching monitoring device for monitoring a switching operation of a relay switching contact of a relay, the switching monitoring device comprising:
   a control terminal configured to apply a control signal for switching the relay switching contact to the relay switching contact;
   a controller configured to produce an excitation signal; and
   an impedance circuit having a signal input and a signal output, wherein the controller is configured to apply the excitation signal to the signal input, wherein the impedance circuit is configured to convert the excitation signal into a switching monitoring signal and to output the switching monitoring signal at the signal output for application to the relay switching contact;
   wherein the controller is further configured to detect a change in a signal present at the impedance circuit and, if the change in the signal is present, to detect the switching operation of the relay switching contact;
   wherein the controller comprises a measuring circuit configured to monitor the change in the excitation signal;
   wherein the controller comprises a signal generator configured to generate the excitation signal;
   wherein the impedance circuit comprises a transformer with a primary-side coil and a secondary-side coil, wherein the secondary-side coil is connected in parallel to the relay switching contact, wherein the primary-side coil is connected to the signal generator; and
   wherein the impedance circuit comprises a capacitor arranged in series with the secondary-side coil.

2. The switching monitoring device according to claim 1, wherein the signal present at the impedance circuit comprises one or more of: the excitation signal or the switching monitoring signal.

3. The switching monitoring device according to claim 1, wherein the relay is configured to transmit signals in a first frequency range and the switching monitoring signal is in a second frequency range, and wherein the second frequency range has higher frequencies than the first frequency range, and wherein the impedance circuit has a higher impedance in the first frequency range than in the second frequency range.

4. The switching monitoring device according to claim 3, wherein the controller is configured to produce the excitation signal in the second frequency range.

5. The switching monitoring device according to claim 1, wherein the measuring circuit has a current sensor connected between the signal generator and the impedance circuit, wherein the current sensor is configured to detect a current flow between the signal generator and the impedance circuit and to provide a measured current value of the current flow to the controller, and wherein the controller is configured to detect a change in the current flow between the signal generator and the impedance circuit based at least in part on the measured current value.

6. The switching monitoring device according to claim 1, wherein the impedance circuit is configured to galvanically separate the relay switching contact from one or more of: the signal generator or the controller.

7. The switching monitoring device according to claim 1, wherein the capacitor is configured to form a reactance for alternating voltage signals applied to the relay switching contact.

8. The switching monitoring device according to claim 1, wherein the signal output is bipolar with a first output connection and a second output connection, the switching monitoring device further comprising:
   a first coupling capacitor; a second coupling capacitor; and a signal monitoring circuit, wherein the first coupling capacitor is configured to connect to the first output connection and the second coupling capacitor is configured to connect to the second output connection, wherein the first coupling capacitor and the second coupling capacitor are connected to the signal monitoring circuit and are further configured to convert the switching monitoring signal into a test signal and to provide the test signal to the signal monitoring circuit, and wherein the signal monitoring circuit is adapted to detect a change in the test signal and to detect the switching operation of the relay switching contact when the change in the test signal is present.

9. The switching monitoring device according to claim 1, wherein the controller is configured to connect to the control terminal and apply the control signal to the control terminal.

10. The switching monitoring device according to claim 9, wherein the controller comprises a switching controller configured to produce the control signal for switching the relay switching contact and to apply the control signal to a magnet system of the relay to switch the relay switching contact.

11. The switching monitoring device according to claim 9, wherein the controller is configured to apply the control signal to the signal generator, and wherein the signal generator is configured to produce the excitation signal with the control signal.

12. The switching monitoring device according to claim 11, wherein the signal generator is adapted to produce the excitation signal as a periodic clock signal, and wherein the controller is adapted to detect a switching time delay of the relay switching contact, including detecting a time interval between the generation of the excitation signal and a change in the excitation signal when an impedance at the signal output changes, based on a constant period of the excitation signal.

13. The switching monitoring device according to claim 1, wherein the controller has a control output, wherein the controller is configured to provide a status signal at the control output, and wherein the status signal is active after the relay switching contact is switched on and is inactive after the relay switching contact is switched off.

14. The switching monitoring device according to claim 1, further comprising a first damping element, wherein the signal output has a first output connection followed by the first damping element, and wherein the first damping element is configured to dampen high-frequency signals applied to the relay switching contact via one or more of: the impedance circuit, an electrical load, or a voltage source coupled to the relay switching contact.

15. The switching monitoring device according to claim 14, further comprising a second damping element, wherein the signal output has a second output connection followed by the second damping element, and wherein the second damping element is configured to dampen high-frequency signals applied via the impedance circuit to one or more of: the relay switching contact, the electrical load, or the voltage source coupled to the relay switching contact.

* * * * *